United States Patent
Yoon et al.

(10) Patent No.: US 9,165,620 B2
(45) Date of Patent: Oct. 20, 2015

(54) MEMORY SYSTEM AND OPERATING METHOD THEREOF

(71) Applicant: SK hynix Inc., Gyeonggi-do (KR)

(72) Inventors: Hyunsu Yoon, Gyeonggi-do (KR); Youncheol Kim, Gyeonggi-do (KR); Jeongsu Jeong, San Jose, CA (US)

(73) Assignee: SK Hynix Inc., Gyeonggi-do (KR)

(*) Notice: Subject to any disclaimer, the term of this patent is extended or adjusted under 35 U.S.C. 154(b) by 329 days.

(21) Appl. No.: 13/672,293

(22) Filed: Nov. 8, 2012

(65) Prior Publication Data

US 2014/0126304 A1    May 8, 2014

(51) Int. Cl.
   *G11C 7/00* (2006.01)
   *G11C 7/20* (2006.01)
   *G11C 29/44* (2006.01)
   *G11C 29/00* (2006.01)

(52) U.S. Cl.
   CPC .............. *G11C 7/20* (2013.01); *G11C 29/4401* (2013.01); *G11C 29/785* (2013.01); *G11C 29/802* (2013.01); *G11C 2029/4402* (2013.01)

(58) Field of Classification Search
   CPC ........ G11C 7/1051; G11C 7/1078; G11C 7/22
   USPC ................ 365/200, 189.05, 233.1, 233.11
   See application file for complete search history.

(56) References Cited

U.S. PATENT DOCUMENTS

| | | | |
|---|---|---|---|
| 6,667,902 B2 | 12/2003 | Peng | |
| 6,777,757 B2 | 8/2004 | Peng et al. | |
| 6,904,751 B2 | 6/2005 | Makki et al. | |
| 7,173,851 B1 | 2/2007 | Callahan et al. | |
| 7,269,047 B1 | 9/2007 | Fong et al. | |
| 7,768,847 B2 * | 8/2010 | Ong et al. | 365/200 |
| 7,908,527 B2 * | 3/2011 | Kohara et al. | 714/711 |
| 8,023,347 B2 * | 9/2011 | Chu et al. | 365/200 |

* cited by examiner

*Primary Examiner* — Son Dinh
(74) *Attorney, Agent, or Firm* — IP & T Group LLP

(57) ABSTRACT

A memory system includes one or more memory chips, and a repair information storage chip including a nonvolatile memory configured to store a repair information of the one or more memory chips, wherein during an initial operation of the memory system, the repair information stored in the repair information storage chip is transmitted to the one or more memory chips.

10 Claims, 7 Drawing Sheets

MEMORY SYSTEM AND OPERATING METHOD THEREOF

BACKGROUND

1. Field

Exemplary embodiments of the present invention relate to a memory system, and more particularly, to a technology for storing and transmitting repair information in a memory system.

2. Description of the Related Art

FIG. 1 is a diagram for illustrating a repair operation of a conventional memory device.

Referring to FIG. 1, the conventional memory device includes a cell array 110, a row circuit 120, and a column circuit 130. The cell array 110 includes a plurality of memory cells. The row circuit 120 is configured to enable a word line selected by a row address R_ADD. The column circuit 130 is configured to access (read or write) data of a bit line selected by a column address C_ADD.

A row fuse circuit 140 is configured to store a row address, corresponding to a memory cell having a defect in the cell array 110, and generate a repair row address REPAIR_R_ADD. A row comparison unit 150 is configured to compare the repair row address REPAIR_R_ADD stored in the row fuse circuit 140 to the row address R_ADD inputted from an external source. When the repair row address REPAIR_R_ADD coincides with the row address R_ADD, the row comparison unit 150 controls the row circuit 120 to enable a redundant word line instead of the word line designated by the row address R_ADD.

A column fuse circuit 160 is configured to store a column address, corresponding to a memory cell having a defect in the cell array 110, and generate a repair column address REPAIR_C_ADD. A column comparison unit 170 is configured to compare the repair column address REPAIR_C_ADD from the column fuse circuit 160 to the column address C_ADD inputted from an external source. When the repair column address REPAIR_C_ADD coincides with the column address C_ADD, the column comparison unit 170 controls the column circuit 130 to access a redundant bit line, instead of the bit line designated by the column address C_ADD.

The row fuse circuit 140 and the column fuse circuit 160 (hereinafter referred to as the fuse circuits) of FIG. 1 use laser fuses. The laser fuse stores high or low data depending on whether the fuse is cut or not. The laser fuse may be programmed in a wafer state, but may not be programmed after the wafer is mounted in a package. To overcome such a concern, an E-fuse may be used. The E-fuse may include a transistor. When the E-fuse includes a transistor, the E-fuse stores data by changing resistance between a gate and a drain/source.

FIG. 2 is a diagram illustrating that the E-fuse including a transistor operates as a resistor or capacitor.

Referring to FIG. 2, the E-fuse includes a transistor T. When a normal power supply voltage which the transistor T may tolerate is supplied to a gate G, the E-fuse operates as a capacitor C. Therefore, there is no current flowing between the gate G and a drain D or source S (hereinafter referred to as a drain-source D-S). However, when a high voltage, which the transistor T may not stand, is applied to the gate G, gate oxide of the transistor T may become inoperable and short the gate G and the drain-source D-S. In this case, the E-fuse operates as a resistor R. Therefore, a current flows between the gate G and the drain-source D-S.

Such a characteristic may be used to recognize the data of the E-fuse through a resistance value between the gate G and the drain-source D-S of the E-fuse. To recognize the data of the E-fuse, (1) the size of the transistor T may be increased to directly recognize the data without a separate sensing operation, or (2) an amplifier may be used to sense a current flowing in the transistor T without increasing the size of the transistor T. In the above-described two methods, however, the transistor T forming the E-fuse must be enlarged, or the amplifier for amplifying data must be provided for each E-fuse. Therefore, both methods have limitations and concerns over the size and space.

Because of the above-described concerns related to the size and space, it may not be easy to apply the E-fuse to the fuse circuits 140 and 160 of FIG. 1. Therefore, as disclosed in U.S. Pat. Nos. 6,904,751, 6,777,757, 6,667,902, 7,173,851, and 7,269,047, researches have been conducted on a method for performing a repair operation using data stored in an E-fuse array including a plurality of E-fuses (in this case, the entire area may be reduced because an amplifier is shared).

SUMMARY

Exemplary embodiments of the present invention are directed to a technology for storing repair information in a memory chip including nonvolatile memories such as an E-fuse array and transmitting the repair information to memory chips to repair a memory chip, in a system including a plurality of memory chips, such as a multi-chip package.

In accordance with an embodiment of the present invention, a memory system includes one or more memory chips, and a repair information storage chip including a nonvolatile memory configured to store repair information of the one or more memory chips, wherein during an initial operation of the memory system, the repair information stored in the repair information storage chip is transmitted to the one or more memory chips.

In accordance with another embodiment of the present invention, there is provided an operating method of a memory system which includes one or more memory chips and a repair information storage chip. The operation method includes powering up the memory system, transmitting, by the repair information storage chip, a repair information to the one or more memory chips, and replacing failed cells in the one or more memory chips with redundant cells using the repair information, during read and write operations of the one or more memory chips.

DETAILED DESCRIPTION

Figure 1:
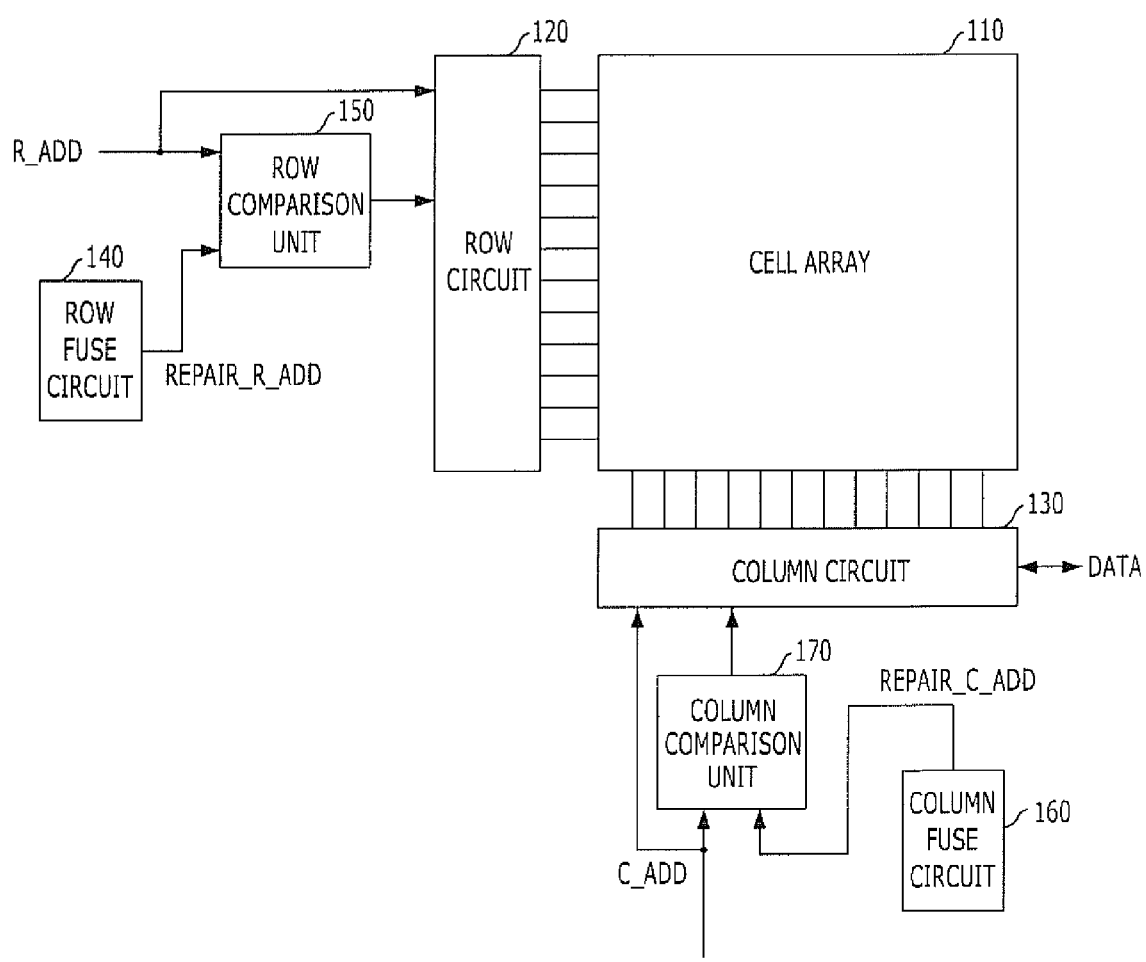
FIG. 1 is a diagram for illustrating a repair operation of a conventional memory device.
Figure 2:
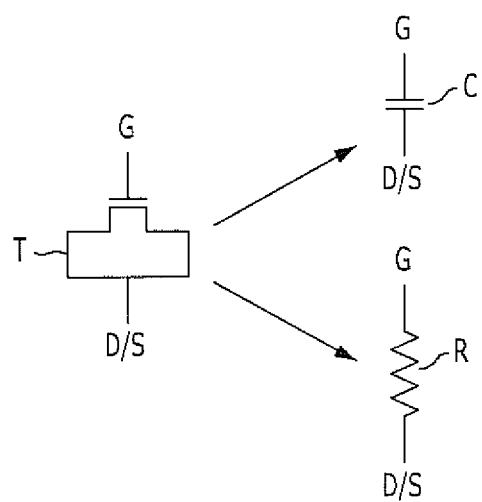
FIG. 2 is a diagram illustrating that an E-fuse including a transistor operates as a resistor or capacitor.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
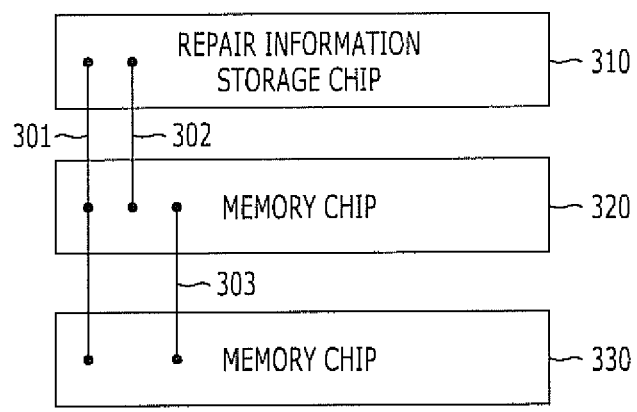
FIG. 3 is a diagram illustrating a memory system in accordance with an embodiment of the present invention.

FIG. 3 is a diagram illustrating a memory system in accordance with an embodiment of the present invention.

The memory system in accordance with the embodiment of the present invention may refer to a system including a plurality of memory chips and a repair information storage chip, which are stacked in one semiconductor package. Furthermore, the memory system in accordance with the embodiment of the present invention may refer to a system including a plurality of memory chips and a repair information storage chip, which exist over the same substrate or module. FIG. 3 illustrates a memory system in which memory chips 320 and 330 and a repair information storage chip 310 are stacked.

Referring to FIG. 3, the memory system includes a repair information storage chip 310 and one or more memory chips 320 and 330.

The repair information storage chip 310 is configured to store repair information. In the conventional memory device of FIG. 1, the repair information is stored in the fuse circuits 140 and 160. The repair information storage chip 310 may store the repair information of all memory chips 320 and 330 within the memory system. The repair information storage chip 310 may include various nonvolatile memories such as an E-fuse array, a flash memory array, and Electrically Erasable Programmable Read-Only Memory (EEPROM). The repair information of the memory chips 320 and 330 in the memory system is stored in the repair information storage chip 310. Therefore, unlike the conventional memory device requiring an operation of programming fuse circuits in memory chips to store repair information, the memory system does not require the programming operation. That is, the memory system in accordance with the embodiment of the present invention simply programs only the repair information storage chip 310 after conducting defect analysis on the memory chips 320 and 330. The memory system includes a plurality of data transmission channels 301 to transmit the repair information between the repair information storage chip and the respective memory chips. In this embodiment of the present invention, the memory system includes eight data transmission channels 301. Furthermore, the memory system includes a first clock channel 302 formed between the repair information storage chip 310 and the memory chip 320. In addition, the memory system includes a second clock channel 303 formed between the memory chip 320 and the memory chip 330. During an initial operation period of the memory system, that is, before a normal operation, such as a read or write operation, is performed and after a power-up of the memory system, the repair information storage chip 310 outputs repair information to the data transmission channel 301. Furthermore, the repair information storage chip 310 outputs a clock signal synchronized with the repair information to the first clock channel 302.

The memory chips 320 and 330 receive the repair information from the repair information storage chip 310 during the initial operation period of the memory system, and repair their failed memory cells with redundant memory cells. Here, repairing is to access a redundant memory cell to instead of a failed memory cell, when the failed memory cell is selected by an address during a read or write operation. The memory chips 320 and 330 include a plurality of latch sets. The memory chips 320 and 330 store the repair information received from the repair information storage chip 310 in the latch sets, and repair their failed memory cells by using the repair information stored in the latch sets. The process in which the memory chips 320 and 330 store the repair information, which is transmitted to the data transmission channel 301 in the internal latch sets, using clock signals transmitted through the clock channels 302 and 303, will be described in detail with reference to the accompanying drawings.

For reference, when the chips 310 to 330 are stacked as illustrated in FIG. 3, the channels 301 to 303 may be formed as through-silicon vias (TSVs). When the chips 310 to 330 exist over a module or substrate (for example, a PCB substrate), the channels may be formed as interconnections over the substrate or module.

Figure 4:
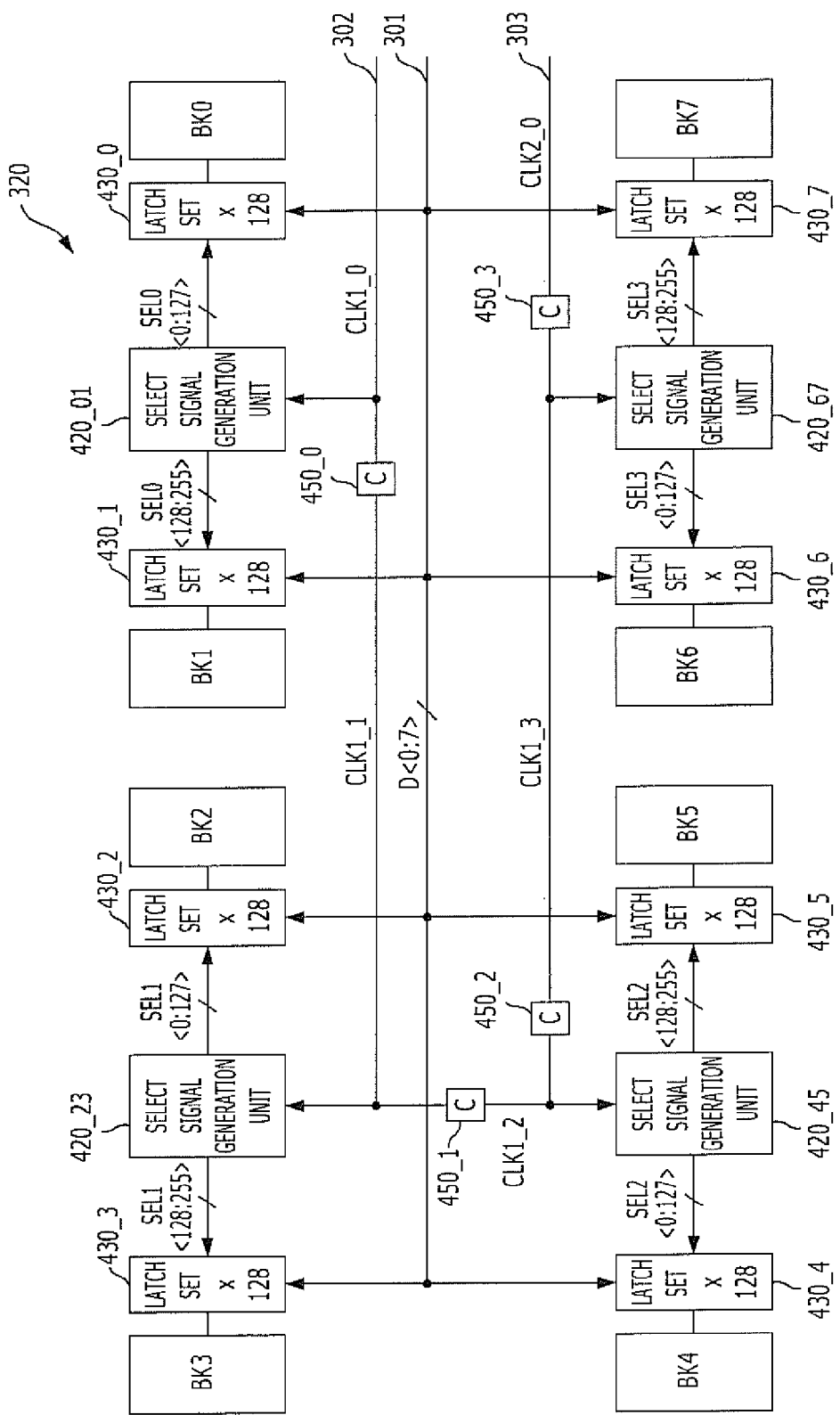
FIG. 4 is a configuration diagram of a memory chip 320 of FIG. 3.

FIG. 4 is a configuration diagram of the memory chip 320 of FIG. 3.

FIG. 4 illustrates the process in which the memory chip 320 stores repair information D<0:7>, which is transmitted to the data transmission channel 301, using first clock signals CLK1_0 to CLK1_3 transmitted to the first clock channel 302.

Referring to FIG. 4, the memory chip 320 includes a plurality of memory banks BK0 to BK7, a select signal generation circuit including a plurality of select signal generation units 420_01, 420_23, 420_45, and 420_67 each provided for every two banks, a plurality of latch sets 430_0 to 430_7 provided for the banks BK0 to BK7, respectively, and a clock transmission circuit including a plurality of clock transmission units 450_0 to 450_3.

The select signal generation unit 420_01 is configured to generate select signals SEL0<0:255> by using the inputted first clock signal CLK1_0. Specifically, the select signal generation unit 420_01 sequentially activates each of the select signals SEL0<0:255> whenever the first clock signal CLK1_0 toggles. For example, when the first clock signal CLK1_0 toggles for the first time, the select signal SEL0<0> is activated, and when the first clock signal CLK1_0 toggles for the second time, the select signal SEL0<1> is activated. After the last select signal SEL0<255> is activated, the select signal generation unit 420_01 is disabled. The other select signal generation units 420_23, 420_45, and 420_67 also sequentially activate each of select signals SEL1<0:255>, SEL2<0:255>, and SEL3<0:255>, respectively, whenever the first clock signals CLK1_1 to CLK1_3 received by the respective select signal generation units 420_23, 420_45, and 420_67 toggle.

The latch sets 430_0 to 430_7 are enabled by the corresponding select signals SEL0<0:255>, SEL1<0:255>, SEL2<0:255>, and SEL3<0:255>. The enabled latch set receives and stores the repair information D<0:7> transmitted through the data transmission channel 301. For example, when the select signal SEL1<0> is activated, a first latch set among the latch sets 430_0 corresponding to the bank BK0 receives and stores the repair information D<0:7> transmitted through the data transmission channel 301. Similarly, when the select signal SEL1<1> is activated, a second latch set among the latch sets 430_0 receives and stores the repair information D<0:7> transmitted through the data transmission channel 301.

The clock transmission units 450_0 to 450_3 are configured to transmit input clock signals as output clock signals, after all of the select signals SEL0<0:255>, SEL1<0:255>, SEL2<0:255>, and SEL3<0:255> generated by the select signal generation units 420_01, 420_23, 420_45, and 420_67 corresponding to the respective clock transmission units among the clock transmission units 450_0 to 450_3 are activated. For example, when the first clock signal CLK1_1 is activated for 256 times, the select signal generation unit 420_23 activates all of the select signals SEL1<0:255>, and the clock transmission unit 450_1 transmits the first clock signal CLK1_1 as the first clock signal CLK1_2. In particular, the last clock transmission unit 450_3 transmits the first clock signal CLK1_3 as a second clock signal CLK2_0 to the second clock channel 303 after the first clock signal CLK1_3 is activated for 256 times. The second clock signal CLK2_0 transmitted to the second clock channel 303 is transmitted to the memory chip 330.

The memory banks BK0 to BK7 perform their repair operations by using the repair data stored in the corresponding latch sets 430_0 to 430_7. Here, repairing is to access a redundant memory cell instead of a failed memory cell, when the failed memory cell is selected by an address during a read or write operation.

In the memory chip 320, while the first clock signal CLK1_0 inputted through the first clock channel 302 toggles 1,024 times, the repair information inputted through the data transmission channel 301 is sequentially stored in the latch sets 430_0 to 430_7. After the repair information is stored in latch sets 430_0 to 430_7, the first clock signal CLK1_0 is transmitted as the second clock signal CLK2_0 to the memory chip 330 through the second clock channel 303. Here, since the memory chip 320 includes the latch sets 430_0 to 430_7, which collectively include 1,024 latch sets, 1,024 clock cycles are used to store the repair information in all of the latch sets 430_0 to 430_7. However, the time required for storing the repair information in all latch sets may be changed depending on the number of latch sets.

FIG. 4 illustrates the select signal generation circuit is divided into the plurality of select signal generation units 420_01, 420_23, 420_45, and 420_67 to generate the select signals SEL0<0:255>, SEL1<0:255>, SEL2<0:255>, and SEL3<0:255> used in the memory chip. In another exemplary embodiment, the select signal generation circuit may include one select signal generation unit to generate the select signals SEL0<0:255>, SEL1<0:255>, SEL2<0:255>, and SEL3<0:255> corresponding to the latch sets 430_0 to 430_7 in the memory chip 320.

Figure 5:
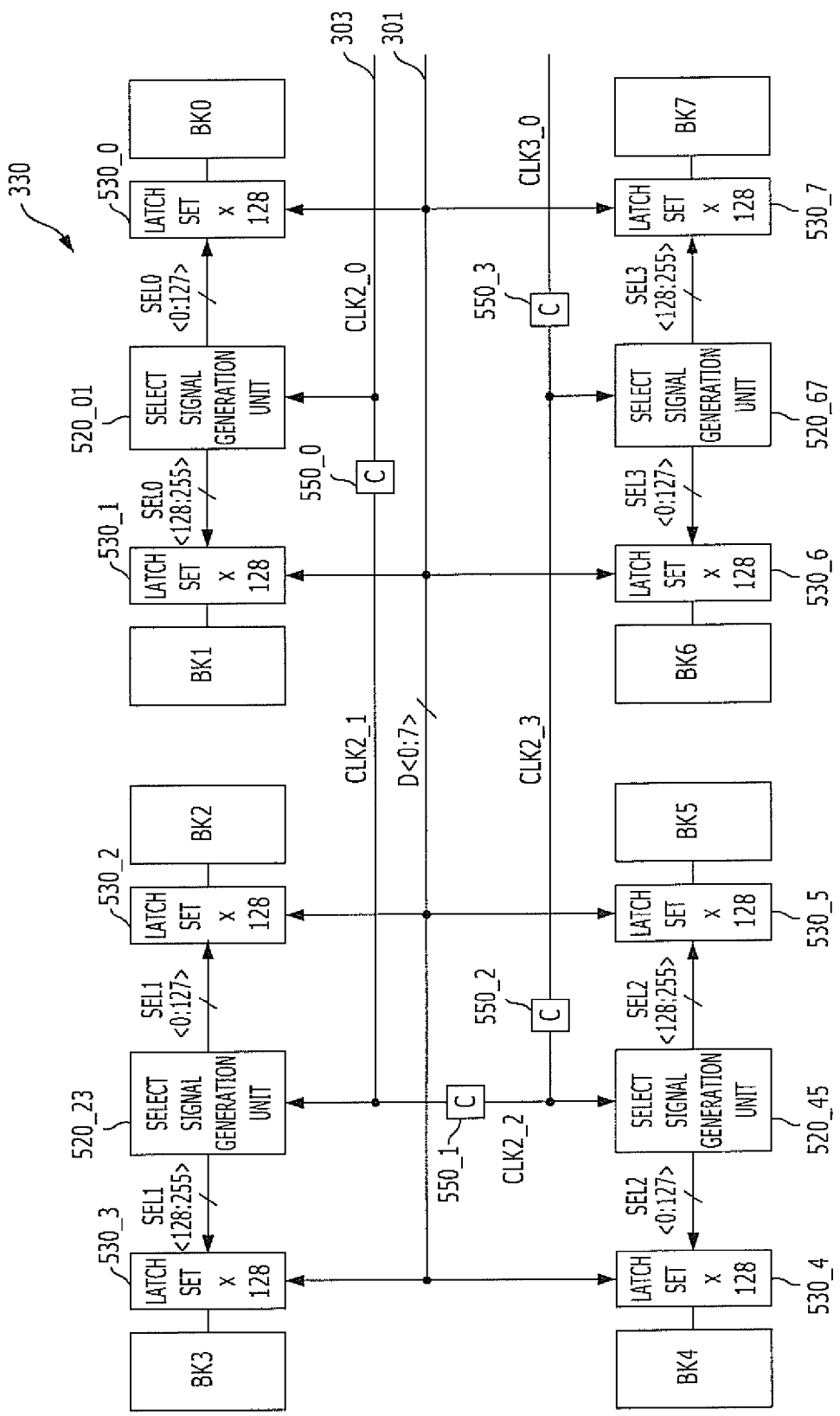
FIG. 5 is a configuration diagram of a memory chip 330 of FIG. 3.

FIG. 5 is a configuration diagram of the memory chip 330 of FIG. 3.

Referring to FIG. 5, the memory chip 330 includes a plurality of memory banks BK0 to BK7, a select signal generation circuit including a plurality of select signal generation units 520_01, 520_23, 520_45, and 520_67 each provided for every two banks, a plurality of latch sets 530_0 to 530_7 provided for the banks BK0 to BK7, respectively, and a clock transmission circuit including a plurality of clock transmission units 550_0 to 550_3.

As illustrated in FIG. 5, the memory chip 330 may be configured in the same manner as the memory chip 320. However, the memory chip 330 is different from the memory chip 320 in that the memory chip 330 uses second clock signals CLK2_0 to CLK2_3 inputted through the second clock channel 303. Furthermore, since another memory chip does not exist at the rear stage of the memory chip 330, the last clock transmission unit 550_3 of the memory chip 330 may be omitted or disabled. However, when another memory chip (for example, memory chip 340) exists, the last clock transmission unit 550_3 may be enabled.

In the memory chip 330, while the second clock signal CLK2_0 inputted through the second clock channel 303 is togged for 1,024 times, the repair information inputted through the data transmission channel 301 is sequentially stored in the latch sets 530_0 to 530_7, which collectively include 1,024 latch sets.

Figure 6:
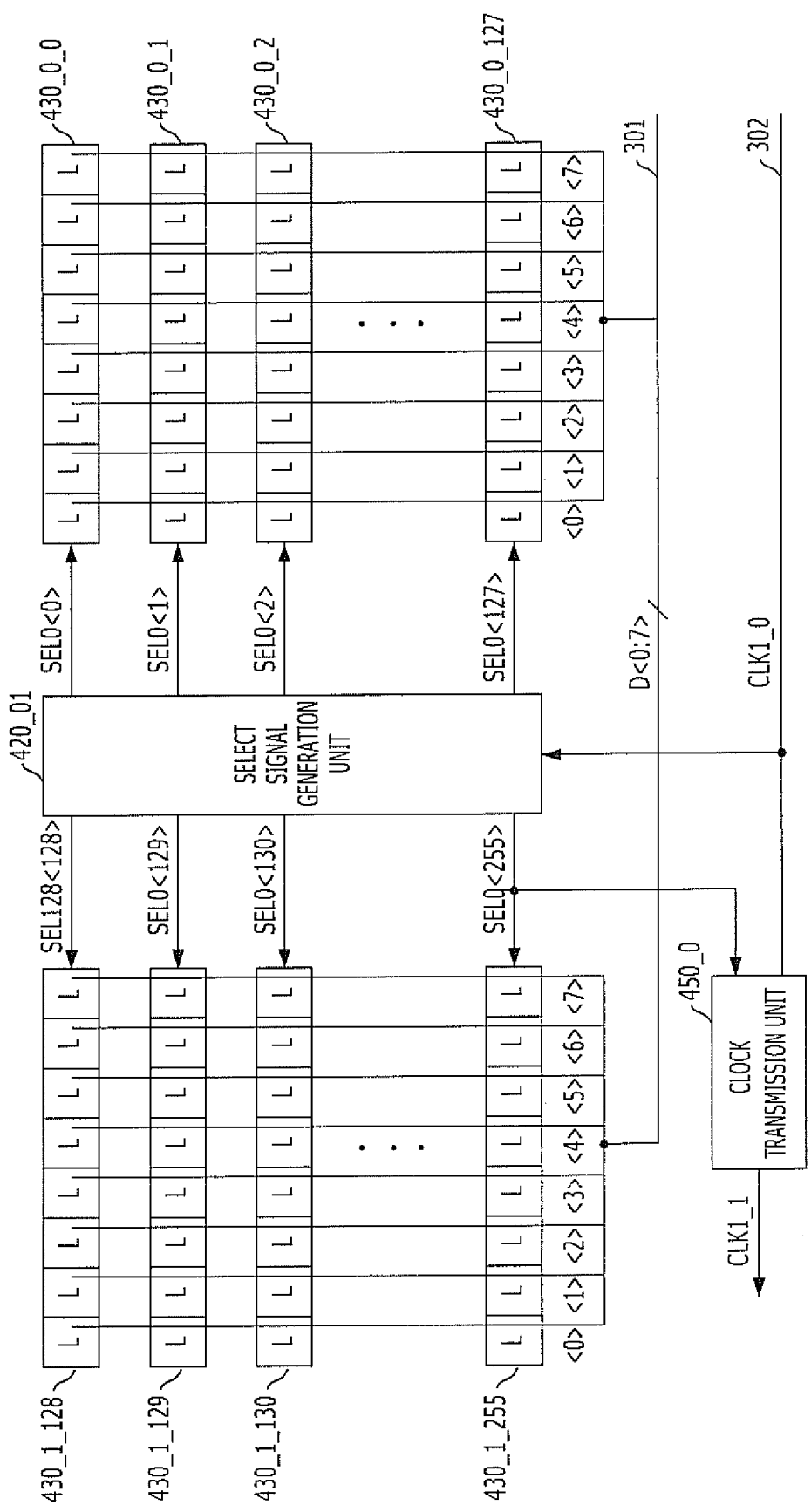
FIG. 6 is a detailed diagram of latch sets 430_0 and 430_1, a select signal generation unit 420_01, and a clock transmission unit 450_0 of FIG. 4.

FIG. 6 is a detailed diagram of the latch sets 430_0 and 430_1, the select signal generation unit 420_01, and the clock transmission unit 450_0 of FIG. 4.

Referring to FIG. 6, each of the latch sets 430_0_0 to 430_0_127 and 430_1_128 to 430_1_255 includes the same number of latches as a bit number of the data channel 301. For example, the exemplary embodiment shown in FIG. 6 includes eight latches and the data channel 301 has eight bits. The respective latch sets are enabled by the corresponding select signals SEL0<0:255>, and the enabled latch sets receive and store the repair information D<0:7> transmitted to the data channel 301. For example, when the select signal SEL0<2> is activated, eight latches forming the latch set 430_0_2 receive and store the repair information D<0:7>, and when the select signal SEL0<255> is activated, eight latches forming the latch set 430_1_255 receive and store the repair information.

The clock transmission unit 450_0 is configured to transmit the first clock signal CLK1_0 as the first clock signal CLK1_1, after all of the select signals 0<0:255> are activated, that is, after the repair information D<0:7> is stored in all latch sets. The clock transmission unit 450_0 receives the select signal SEL0<255>, which is activated lastly among the select signals SEL0<0:255>, and the select signal SEL0<255> informs the clock transmission unit 450_0 that all of the select signals SEL0<0:255> were activated. Until the last select signal SEL0<255> is activated, the clock transmission unit 450_0 fixes the level of the first clock signal CLK1_1 to a low level.

Figure 7:
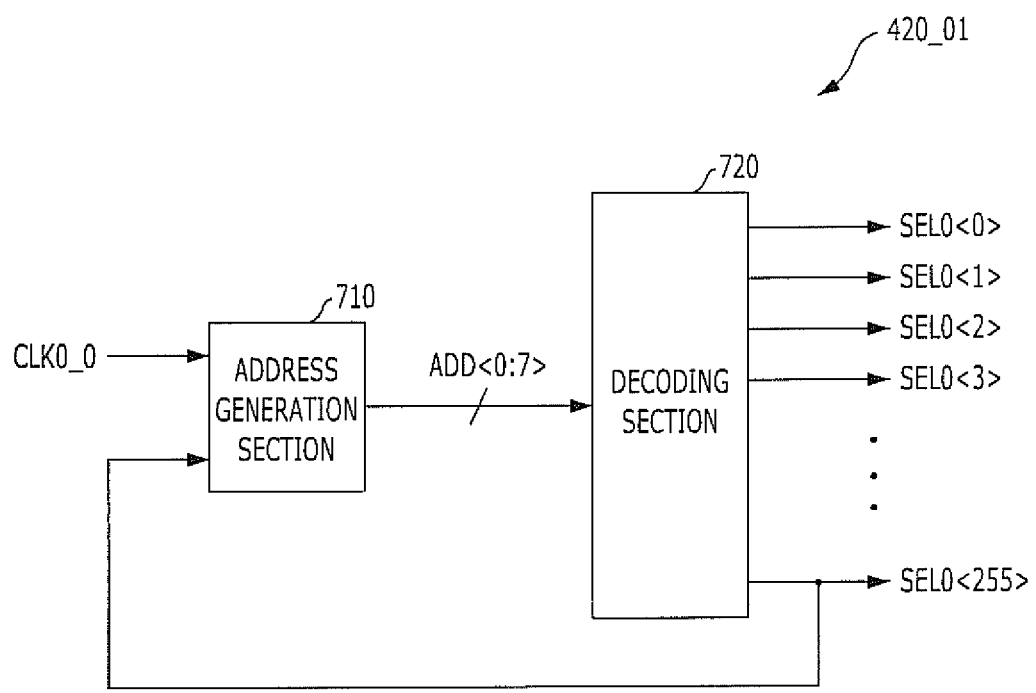
FIG. 7 is a configuration diagram of the select signal generation unit 420_01 of FIG. 6.

FIG. 7 is a configuration diagram of the select signal generation unit 420_01 of FIG. 6.

Referring to FIG. 7, the select signal generation unit 420_01 includes an address generation section 710 and a decoding section 720.

The address generation section 710 is configured to count the inputted first clock signal CLK1_0 and generate an address ADD<0:7>. FIG. 6 illustrates a case in which the number of select signals SEL0<0:255> is set to 256. Therefore, the address ADD<0:7> is configured as an eight-bit binary code. The address generation section 710 may be designed by using a counter.

The decoding section 720 is configured to decode the address ADD<0:7> and generate the select signals SEL0<0:255>. As described above, the address ADD<0:7> includes an eight-bit binary code. Therefore, the address ADD<0:7> may be decoded to activate one of the select signals SEL0<0:255>.

When the last select signal SEL0<255> is activated, data are stored in all of the latch sets 430_0_0 to 430_0_127 and 430_1_128 to 430_1_255 corresponding to the select signal generation unit 420_01. Therefore, the select signal no longer needs to be activated. Accordingly, when the last select signal SEL0<255> is activated, the address generation section 710 and the decoding section 720 are deactivated. As a result, all of the select signals SEL0<0:255> continuously maintain a deactivated state.

Figure 8:
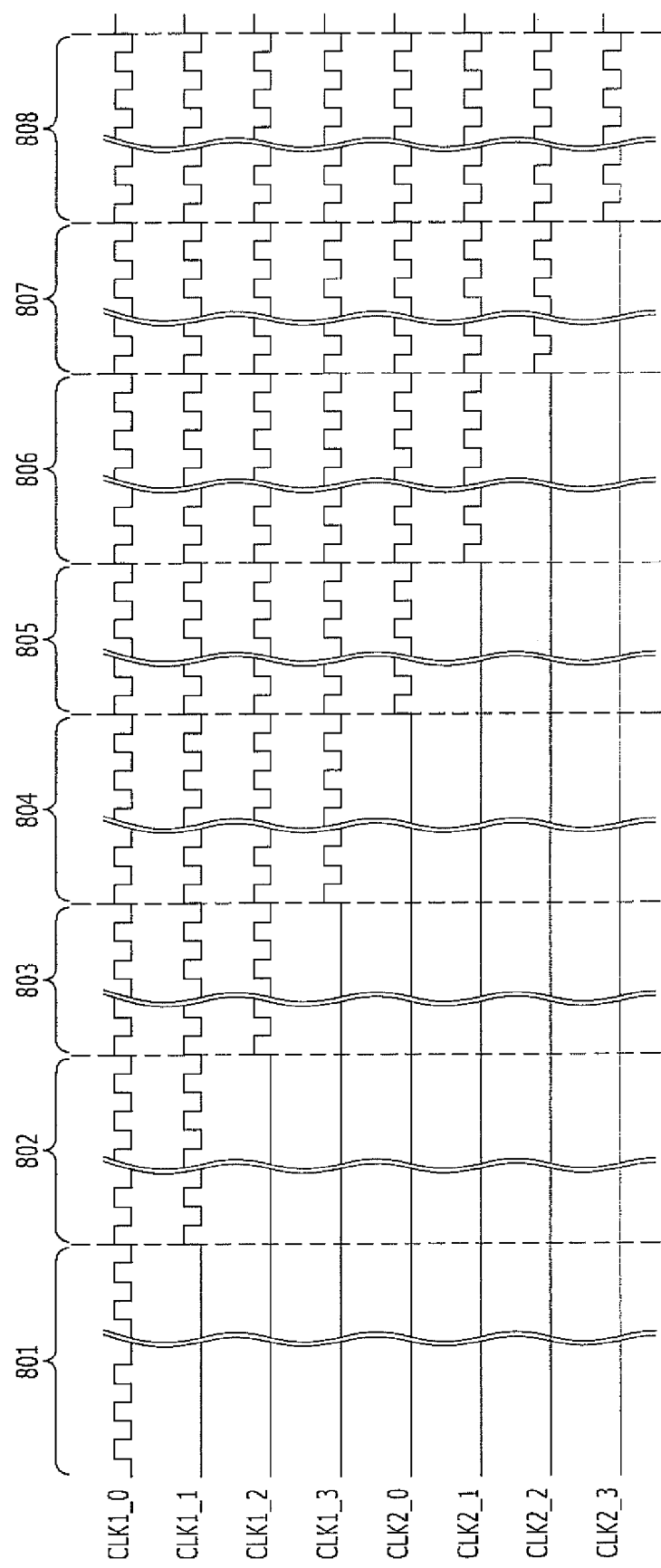
FIG. 8 is a diagram illustrating first clock signals CLK1_0 to CLK1_3 used in the memory chip 320 of FIG. 4 and second clock signals CLK2_0 to CLK2_3 used in the memory chip 330 of FIG. 5.

FIG. 8 is a diagram illustrating the first clock signals CLK1_0 to CLK1_3 used in the memory chip 320 of FIG. 4 and the second dock signals CLK2_0 to CLK2_3 used in the memory chip 330 of FIG. 5.

Referring to FIG. 8, the first clock signal CLK1_0 starts to toggle at the same time when the repair information is outputted from the repair information storage chip 310. After the first clock CLK1_0 toggles, the repair information is stored in the latch sets 430_0 and 430_1 in the memory chip 320 during a first 256-clock cycle period 801.

After the period 801, clock transmission of the clock transmission unit 450_0 is started, and the first clock signal CLK1_1 starts to toggle. After the first clock CLK1_1 toggles, the repair information is stored in the latch sets 430_2 and 430_3 in the memory chip 320 during a second 256-clock cycle period 802.

After the period 802, clock transmission of the clock transmission unit 450_1 is started, and the first clock signal CLK1_2 starts to toggle. After the first clock CLK1_2 toggles, the repair information is stored in the latch sets 430_4 and 430_5 in the memory chip 320 during a third 256-clock cycle period 803.

After the period 803, clock transmission of the clock transmission unit 450_2 is started, and the first clock signal CLK1_3 starts to toggles. After the first clock CLK1_3 toggles, the repair information is stored in the latch sets 430_6 and 430_7 in the memory chip 320 during a fourth 256 clock-cycle period 804.

After the period 804, the clock transmission unit 450_3 starts to transmit the first clock signal CLK1_3 as the second clock signal CLK2_0 to the memory chip 330 through the second clock signal 303. After the second clock signal CLK2_0 starts to toggle, the repair information is stored in the latch sets 530_0 and 530_1 in the memory chip 330 during a fifth 256-clock cycle period 805.

After the period 805, clock transmission of the clock transmission unit 550_0 is started, and the second clock signal CLK2_1 starts to toggle. After the second clock signal CLK2_1 toggles, the repair information is stored in the latch sets 530_2 and 530_3 in the memory chip 330 during a sixth 256-clock cycle period 806.

After the period 806, clock transmission of the clock transmission unit 550_1 is started, and the second clock signal CLK2_2 starts to toggles. After the second clock signal CLK2_2 toggles, the repair information is stored in the latch sets 530_4 and 530_5 in the memory chip 330 during a seventh 256-clock cycle period 807.

After the period 807, clock transmission of the clock transmission unit 550_2 is started, and the second clock signal CLK2_3 starts to toggles. After the second clock signal CLK2_3 toggles, the repair information is stored in the latch sets 530_6 and 530_7 in the memory chip 330 during an eighth 256-clock cycle period 808.

In this way, the operation of transmitting the repair information from the repair information storage chip 310 to the memory chip 320 and the memory chip 330 is competed.

In accordance with the embodiments of the present invention, the repair information of the memory chips is stored in the repair information storage chip, which is separate from the memory chips, in the memory system. As a result, the memory chips may be repaired by using the repair information stored in the repair information storage chip.

Therefore, the repair information may be collectively stored in the repair information storage chip without recording the repair information in the respective memory chips after defect analysis, and new repair information may be added at any time.

In this embodiment of the present invention, it has been described that the memory system includes two memory chips. However, the memory system may include a greater or smaller number of memory chips, and the repair information storage chip may store repair information of the memory chips.

While the present invention has been described with respect to the specific embodiments, it will be apparent to those skilled in the art that various changes and modifications may be made without departing from the spirit and scope of the invention as defined in the following claims.

What is claimed is:

1. A memory system comprising:
   one or more memory chips;
   a repair information storage chip comprising a nonvolatile memory configured to store a repair information of the one or more memory chips;
   a first clock transmission channel configured to transmit a first clock signal between the repair information storage chip and a first memory chip of the one or more memory chips; and
   a data transmission channel disposed between the repair information storage chip and the one or more memory chips, to transmit the repair information,
   wherein during an initial operation of the memory system, the repair information stored in the repair information storage chip is transmitted to the one or more memory chips.

2. The memory system of claim 1, further comprising a second clock transmission channel disposed between the first memory chip and a second memory chip among the one or more memory chips, to transmit a second clock signal.

3. The memory system of claim 1, wherein the repair information storage chip transmits the repair information to the data transmission channel, and transmits the first clock signal, which is synchronized with the repair information, to the first clock transmission channel, and
   the first memory chip comprises:
   a first select signal generation circuit configured to generate a plurality of first select signals using the first clock signal; and
   a plurality of first latch sets configured to be enabled by the corresponding first select signals among the plurality of first select signals, and store the repair information transmitted to the data transmission channel.

4. The memory system of claim 2, wherein the repair information storage chip transmits the repair information to the data transmission channel, and transmits the first clock signal, which is synchronized with the repair information, to the first clock transmission channel,
   the first memory chip comprises:
   a first select signal generation circuit configured to generate a plurality of first select signals using the first clock signal;
   a plurality of first latch sets configured to be enabled by the corresponding first select signals among the plurality of first select signals, and store the repair information transmitted to the data transmission channel; and
   a clock transmission circuit configured to transmit the first clock signal as the second clock signal through the second clock transmission channel, after all of the first select signals are activated, and
   the second memory chip comprises:
   a second select signal generation circuit configured to generate a plurality of second select signals using the second clock signal; and
   a plurality of second latch sets configured to be enabled by the corresponding second select signals among the plurality of second select signals, and store the repair information transmitted to the data transmission channel.

5. The memory system of claim 4, wherein the second clock signal is deactivated until the clock transmission circuit transmits the first clock signal as the second clock signal.

6. The memory system of claim 4, wherein the first select signal generation circuit comprises:
   a first address generation circuit configured to count the first clock signal and generate a first address; and
   a first decoding circuit configured to decode the first address and generate the plurality of first select signals, and
   the second select signal generation circuit comprises:
   a second address generation circuit configured to count the second clock signal and generate a second address; and
   a second decoding circuit configured to decode the second address and generate the plurality of second select signals.

7. The memory system of claim 4, wherein the first select signal generation circuit is disabled after the repair information is stored in all of the first latch sets, and
   the second select signal generation circuit is disabled after the repair information is stored in all of the second latch sets.

8. The memory system of claim 3, wherein the first memory chip further comprises a plurality of banks configured to replace a failed cell with a redundant cell using the repair information stored in the plurality of first latch sets.

9. An operating method of a memory system which includes one or more memory chips and a repair information storage chip, the operation method comprising:
   powering up the memory system;
   transmitting, by the repair information storage chip, a repair information to the one or more memory chips; and
   replacing failed cells in the one or more memory chips with redundant cells using the repair information, during read and write operations of the one or more memory chips,
   wherein the transmitting of the repair information comprises:
   transmitting the repair information from the repair information storage chip to the one or more memory chips;
   transmitting a first clock signal synchronized with the repair information to a first memory chip of the one or more memory chips;
   generating, the first memory chip, a plurality of first select signals to be sequentially activated by counting the first clock signal; and
   storing the repair information in a first latch set corresponding to an activated first select signal of the first select signals, among a plurality of first latch sets in the first memory chip.

10. The operating method of claim 9, wherein the transmitting of the repair information comprises:
   transmitting the first clock signal as a second clock signal from the first memory chip to a second memory chip of the one or more memory chips, after generating the plurality of first select signals and storing the repair information;
   generating, by the second memory chip, a plurality of second select signals to be sequentially activated by counting the second clock signal; and
   storing the repair information in a second latch set corresponding to an activated second select signal of the second select signals, among a plurality of second latch sets in the second memory chip.

* * * * *